(12) United States Patent
Porter et al.

(10) Patent No.: US 10,739,429 B2
(45) Date of Patent: Aug. 11, 2020

(54) SYSTEM FOR PERFORMING ECHO-PLANAR SPECTROSCOPIC IMAGING

(71) Applicant: Fraunhofer-Gesellschaft zur Foerderung der angewandten Forschung e.V., Munich (DE)

(72) Inventors: David Porter, Regensburg (DE); Marco Vicari, Bremen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 28 days.

(21) Appl. No.: 16/095,345

(22) PCT Filed: Apr. 20, 2017

(86) PCT No.: PCT/EP2017/059407
§ 371 (c)(1),
(2) Date: Oct. 19, 2018

(87) PCT Pub. No.: WO2017/182573
PCT Pub. Date: Oct. 26, 2017

(65) Prior Publication Data
US 2019/0128980 A1 May 2, 2019

(30) Foreign Application Priority Data
Apr. 20, 2016 (DE) .................. 10 2016 206 713

(51) Int. Cl.
*G01R 33/60* (2006.01)
*G01R 33/485* (2006.01)
(Continued)

(52) U.S. Cl.
CPC ......... *G01R 33/485* (2013.01); *G01N 24/081* (2013.01); *G01R 33/482* (2013.01); *G01R 33/5611* (2013.01); *G01R 33/5616* (2013.01)

(58) Field of Classification Search
CPC .............. G01R 33/543; G01R 33/5608; G01R 33/4828; G01R 33/3415; G01R 33/283;
(Continued)

(56) References Cited

U.S. PATENT DOCUMENTS 5,126,673 A * 6/1992 Hennig .............. G01R 33/5615
324/309
6,034,528 A * 3/2000 Heid .................... G01R 33/561
324/307
(Continued)

FOREIGN PATENT DOCUMENTS

JP  2001-8919   1/2001

OTHER PUBLICATIONS

Bito et al., "Echo-Planar Diffusion Spectroscopic Imaging," MRM 33(1):69-73, Jan. 1995.
(Continued)

*Primary Examiner* — Patrick Assouad
*Assistant Examiner* — Taqi R Nasir
(74) *Attorney, Agent, or Firm* — Ellen M. Bierman; Lowe Graham Jones PLLC

(57) ABSTRACT

The invention relates to a system for performing echo-planar spectroscopic imaging. The system comprises an acquisition unit for acquiring magnetic resonance data, wherein the acquisition unit is adapted to use a first encoding gradient in a readout direction and a second encoding gradient in a phase-encoding direction, wherein the first encoding gradient and the second encoding gradient are stepped. The system further comprises a reconstruction unit for reconstructing a magnetic resonance image based on the acquired magnetic resonance data.

15 Claims, 10 Drawing Sheets

(51) Int. Cl.
*G01N 24/08* (2006.01)
*G01R 33/48* (2006.01)
*G01R 33/561* (2006.01)

(58) Field of Classification Search
CPC .... G01R 33/307; G01R 33/60; G01R 33/485;
G01R 33/482; G01R 33/5611; G01R
33/5616; G01V 3/32; E21B 49/08; E21B
2049/085; G01N 24/10; G01N 24/081
USPC ................ 324/307, 309, 318, 322, 314, 316
See application file for complete search history.

(56) References Cited

U.S. PATENT DOCUMENTS 6,310,479 B1 * 10/2001 Zhu ................... A61B 5/055
324/312
6,721,589 B1 * 4/2004 Zhu ..................... G01R 33/563
324/307

OTHER PUBLICATIONS

Breuer et al., "Controlled Aliasing in Parallel Imaging Results in Higher Acceleration (CAIPIRINHA) for Multi-Slice Imaging," MRM 53:684-691, 2005.
Dale et al., "MRI Basic Principles and Applications," Fifth Edition, John Wiley & Sons, Ltd, United Kingdom, 2015, 241 pages.
Du et al., "Breast MR Imaging with High Spectral and Spatial Resolutions: Preliminary Experience1," Radiology 224(2):577-585, Aug. 2002.
Ebel et al, "Achieving Sufficient Spectral Bandwidth for Volumetric 1H Echo-Planar Spectroscopic Imaging at 4 Tesla," MRM 54:697-701, 2005.
Edelstein et al., "Spin warp NMR imaging and applications to human whole-body imaging," Phys. Med. Biol. 25:751-756, May 12, 1980.

Frost et al., "Implementation and Assessment of Diffusion-Weighted Partial Fourier Readout-Segmented Echo-Planar Imaging," MRM 68:441-451, 2012.
Griswold et al., "Generalized Autocalibrating Partially Parallel Acquisitions (GRAPPA)," MRM 47:1202-1210, 2002.
Holdsworth et al., "Robust GRAPPA-Accelerated Diffusion-Weighted Readout-Segmented (RS)-EPI," MRM 62:1629-1640, 2009.
Hu et al., "3D Compressed Sensing for Highly Accelerated Hyperpolarized 13C MRSI With In Vivo Applications to Transgenic Mouse Models of Cancer," MRM 63:312-321, 2010.
International Search Report and Written Opinion of the International Searching Authority completed Jul. 13, 2017, in International Patent Application No. PCT/EP2017/059407, 13 pages.
Mansfield, "Spatial Mapping of the Chemical Shift in NMR," MRM 1, 370-386, 1984.
Matsui et al., "High-Speed Spatially Resolved NMR Spectroscopy Using Phase-Modulated Spin-Echo Trains. Expansion of the Spectral Bandwidth by Combined Use of Delayed Spin-Echo Trains," J. of Magnetic Resonance 64, 167-171, 1985.
Oshio, "vGRASE: Separating Phase and T2 Modulations in 2D," MRM 44:383-386, 2000.
Porter et al., "High Resolution Diffusion-Weighted Imaging Using Readout-Segmented Echo-Planar Imaging, Parallel Imaging and a Two-Dimensional Navigator-Based Reacquisition," MRM 62:468-475, 2009.
Posse et al., "MR Spectroscopic Imaging: Principles and Recent Advances," J. of Magnetic Resonance Imaging 37:1301-1325, 2013.
Pruessmann et al., "SENSE: Sensitivity Encoding for Fast MRI," MRM 42:952-962, 1999.
Robson et al., "Diffusion-Weighted Multiple Shot Echo Planar Imaging of Humans without Navigation," MRM 38:82-88, 1997.
Webb et al., "A Fast Spectroscopic Imaging Method Using a Blipped Phase Encode Gradient," MRM 12(3):306-315, Dec. 1989.

* cited by examiner

SYSTEM FOR PERFORMING ECHO-PLANAR SPECTROSCOPIC IMAGING

CROSS-REFERENCE TO RELATED APPLICATIONS

This application is a US national phase of International Patent Application No. PCT/EP17/59407 filed Apr. 20, 2017, which claims priority from Germany Patent Application No. 102016206713.3 filed Apr. 20, 2016, which applications are incorporated herein by reference in their entireties.

TECHNICAL FIELD

The invention relates to a system, method and computer program for performing Echo-Planar Spectroscopic Imaging (EPSI).

BACKGROUND

Magnetic Resonance Spectroscopic Imaging (MRSI), which is described, for instance, in the article "MR Spectroscopic Imaging: Principles and Recent Advances" by S. Posse et al., Journal of Magnetic Resonance Imaging, 37(6): 1301-25 (2013), can be used in vivo to measure spatially-varying metabolite concentrations for a range of atomic nuclei, including $^1$H, $^{13}$C, $^{15}$N, $^{19}$F, $^{23}$Na, $^{31}$P. The technique combines temporal data sampling with MR imaging techniques to generate localized spectra for individual voxel locations. These spectra can then be used to provide important clinical information in the form of metabolite maps or separate fat and water images.

Data acquisition is more time consuming than for conventional Magnetic Resonance Imaging (MRI) and a rapid technique is required for generating the spatially- and spectrally-encoded data sets in scan times that are suitable for routine clinical examinations. One such method is EPSI disclosed in, for instance, the article "Spatial mapping of the chemical shift in NMR" by P. Mansfield et al., Magnetic Resonance in Medicine, 1(3):370 to 386 (1984), but this technique is severely limited by a low spectral bandwidth, which is insufficient for many applications, particularly at high field strengths, at high spatial resolutions or for metabolites with a large range of chemical shifts.

SUMMARY

It is an object of the present invention to provide a system, method and computer program for performing EPSI, which allow for an increased spectral bandwidth.

In an aspect of the present invention a system for performing EPSI is presented, wherein the system comprises:
an acquisition unit for acquiring MR data, wherein the acquisition unit is adapted to use a first encoding gradient in a readout direction and a second encoding gradient in a phase-encoding direction, wherein the first encoding gradient and the second encoding gradient are stepped,
a reconstruction unit for reconstructing an MR image based on the acquired magnetic resonance data.

DETAILED DESCRIPTION

Figure 1:
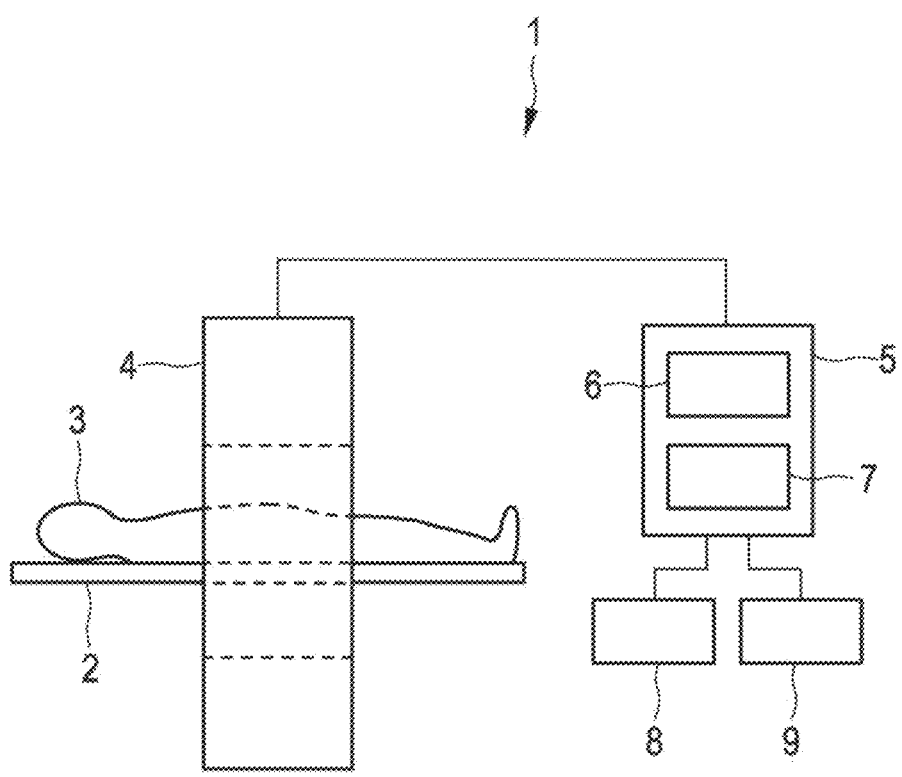
FIG. 1 shows schematically and exemplarily an embodiment of a system for performing EPSI.

In an aspect of the present invention a system for performing EPSI is presented, wherein the system comprises:
an acquisition unit for acquiring MR data, wherein the acquisition unit is adapted to use a first encoding gradient in a readout direction and a second encoding gradient in a phase-encoding direction, wherein the first encoding gradient and the second encoding gradient are stepped,
a reconstruction unit for reconstructing an MR image based on the acquired magnetic resonance data.

The acquisition does therefore not only use a stepping in the phase-encoding direction, but also a stepping in the readout direction, which allows a subset of raw data points in the corresponding direction of the k-space, which may be named $k_x$ direction, to be sampled at each iteration of a readout module, thereby segmenting the readout into multiple acquisitions. This readout segmentation allows for an increased spectral bandwidth in EPSI.

The acquisition unit is preferentially adapted to acquire the MR data by applying a readout module multiple times for different combinations of a) steps of the first encoding gradient and b) steps of the second encoding gradient, wherein a readout module is defined by a sequence of pulses and an MR data acquisition period, wherein the sequence of pulses includes at least an excitation pulse, a pulse of the first encoding gradient and a pulse of the second encoding gradient.

Each combination of a step of the first encoding gradient in the readout direction and a step of the second encoding gradient in the phase-encoding direction defines a respective segment within the k-space, wherein a first direction in the k-space corresponds to the readout direction and a second direction in the k-space corresponds to the phase-encoding direction, wherein in an embodiment the acquisition unit is adapted to acquire the MR data such that in the k-space MR data are not acquired for all segments. In particular, the acquisition unit can be adapted to acquire the MR data such that segments, for which MR data are acquired, and segments, for which MR data are not acquired, are distributed randomly. By not acquiring MR data for all segments in the k-space, the scan time can be reduced. Moreover, by randomly distributing the segments the quality of the finally reconstructed image can be improved.

The stepping of the first encoding gradient in the first direction of the k-space divides the k-space into several columns each comprising several of the segments, wherein the acquisition unit can be adapted to acquire the MR data such that the distribution of segments, for which MR data are acquired, and of segments, for which MR data are not acquired, is different in at least two different columns. In particular, the acquisition unit can be adapted to acquire the MR data such that all columns have different distributions of segments, for which MR data are acquired, and of segments, for which MR data are not acquired, i.e. no two columns have the same distribution. In an embodiment the acquisition unit can be adapted to acquire the MR data such that the distribution of segments, for which MR data are acquired, and of segments, for which MR data are not acquired, is different in different columns having different absolute positions in the first direction of the k-space. Since the first direction of the k-space defines the spatial frequencies in the readout direction in the finally reconstructed image, this allows the distribution of acquired and non-acquired segments to be adapted to the spatial frequency.

The acquisition unit can be adapted to acquire the MR data such that in each column the segments, for which MR data are acquired, and the segments, for which MR data are not acquired, are distributed randomly. In particular, for each column a different set of random sampling points in the second direction of the k-space, which corresponds to the phase-encoding direction, can be used. This can lead to a further increased quality of the finally reconstructed image.

The acquisition unit can be adapted to acquire the MR data such that at least some columns comprise first ranges of segments, which include randomly distributed segments for which MR data are acquired, and second ranges of segments, for which MR data are not acquired, wherein the size of these ranges is different for at least two different columns. Thus, the random distribution of the segments may be applied only in the first ranges in the respective columns, wherein in the second ranges no data are sampled. In particular, the acquisition unit can be adapted to acquire the MR data such that the first ranges decrease and the second ranges increase with increasing distance from the centre of k-space in the first direction of the k-space for the respective column. Moreover, the acquisition unit can be adapted to acquire the MR data such that the second ranges are located at the upper and/or lower ends of the respective column with respect to the second direction of the k-space. For instance, different columns can sample MR data in different first ranges along the second direction of the k-space, wherein the respective first range can depend on its offset in the first direction from the k-space centre. This allows the number of sample points for columns with large absolute offsets in the first direction to be further reduced by skipping unnecessary data points at, for instance, the corners of the k-space.

In an embodiment the acquisition unit is adapted to acquire the MR data such that a ratio of the segments, for which MR data are not acquired, to the segments, for which MR data are acquired, is different in at least two different columns. In particular, the acquisition unit can be adapted to acquire the MR data such that all columns have different ratios of segments, for which MR data are not acquired, and of segments, for which MR data are acquired, i.e. no two columns have the same ratio. In an embodiment, the acquisition unit is adapted to acquire the MR data such that the ratio depends on the position of the respective column in the first direction of the k-space. For instance, the acquisition unit is adapted to acquire the MR data such that the ratio depends on the absolute position in the first direction of the k-space of the respective column. Thus, in an embodiment each column can use a ratio, which may also be regarded as being an undersampling factor or an acceleration factor, which depends on its offset in the first direction from the k-space centre. In particular, the ratio can increase with increasing distance of the respective column from the k-space centre This allows the acquisition to be adapted to the data sparsity, which can increase at high spatial frequencies which correspond to large offsets in the first direction from the k-space centre.

In an embodiment the acquisition unit is adapted to acquire the MR data for different points in time such that MR data are acquired for several k-spaces which correspond to the different points in time, wherein a ratio of the segments, for which MR data are not acquired in the respective k-space, to the segments, for which MR data are acquired in the respective k-space, increases with time. Thus, for instance, compressed sensing may be used with multiple-echo acquisitions that produce multiple k-spaces at different respective echo times, wherein this optimization may exploit the fact that, due to T2* decay, images at late echo times show increasing sparsity and reduced signal-to-noise ratio (SNR). This increased sparsity allows the undersampling factor to be increased for the later echoes.

Moreover, in an embodiment the acquisition unit is adapted to acquire the MR data for different points in time such that MR data are acquired for several k-spaces which correspond to the different points in time, wherein a range, in which MR data are acquired, in the second direction increases with increasing time while preserving the same field-of-view (FOV), without increasing the number of steps of the second encoding gradient. Thus, for instance, for later echoes with higher data sparsity the same number of phase-encoding steps can be used to sample a greater range in the second direction of the k-space. The increased sparsity can therefore be exploited to achieve an increased spatial resolution for later echoes.

In an embodiment the acquisition unit is adapted to acquire the MR data for different points in time such that MR data are acquired for several k-spaces which correspond to the different points in time, wherein a FOV in an image domain is increased with increasing time while preserving the same spatial resolution, without increasing the number of steps of the second encoding gradient. Thus, for instance, for later echoes with higher data sparsity, the same number of phase-encoding steps can be used with an increased image-domain FOV and the same spatial resolution, corresponding to oversampling of the MR data in the second direction of the k-space in the native acquisition, i.e. before application of the compressed sensing undersampling mask. This can lead to an increased sampling randomness at later echoes, which can improve the performance of compressed sensing reconstruction to extend the data sampling to later time points with suitable SNR, resulting in a higher spectral resolution.

In a further aspect of the present invention a method for performing EPSI is presented, wherein the method comprises:
  acquiring magnetic resonance data, wherein the acquisition unit is adapted to use a first encoding gradient in a readout direction and a second encoding gradient in a phase-encoding direction by an acquisition unit, wherein the first encoding gradient and the second encoding gradient are stepped,
  reconstructing a magnetic resonance image based on the acquired magnetic resonance data by a reconstruction unit.

In another aspect of the present invention a computer program for performing EPSI is presented, wherein the computer program comprises program code means for causing the system as defined by claim 1 to carry out the method as defined by claim 14, when the computer program is run on the system.

It shall be understood that the system of claim 1, the method of claim 14 and the computer program of claim 15 have similar and/or identical preferred embodiments, in particular, as defined in the dependent claims.

It shall be understood that a preferred embodiment of the invention can also be any combination of the dependent claims with the respective independent claim.

These and other aspects of the invention will be apparent from and elucidated with reference to the embodiments described hereinafter.

FIG. 1 shows schematically and exemplarily an embodiment of a system 1 for performing EPSI. The system 1 comprises an acquisition unit 4 for acquiring MR data of a person 3 arranged on a support means 2 like a patient table, wherein the acquisition unit 4 is adapted to use a first encoding gradient $G_R$ in a readout direction and a second encoding gradient $G_P$ in a phase-encoding direction, wherein the first encoding gradient $G_R$ and the second encoding gradient $G_P$ are stepped. The acquisition unit 4 comprises well-known components like dedicated coils for generating radiofrequency (RF) pulses, magnetic field gradient pulses, especially pulses for generating the first encoding gradient $G_R$ and the second encoding gradient $G_P$, and for acquiring the MR data, i.e. for performing the actual data acquisition. The system 1 further comprises a processing and control unit 5 including a reconstruction unit 6 for reconstructing an MR image based on the acquired MR data and a control unit 7 for controlling the system 1, especially the acquisition unit 4 and the reconstruction unit 6. In an embodiment the acquisition unit 4 can also comprise a separate control unit for controlling the acquisition unit.

The system 1 further comprises an input unit 8 like a keyboard, a computer mouse, a touch pad, et cetera and an output unit 9 like a display for showing the reconstructed MR image.

The acquisition unit 4 is adapted to acquire the MR data by applying a readout module multiple times for different combinations of a) steps of the first encoding gradient and b) steps of the second encoding gradient, wherein a readout module is defined by a sequence of pulses and an MR data acquisition period, wherein the sequence of pulses includes at least an excitation pulse, a pulse of the first encoding gradient and a pulse of the second encoding gradient.

In the following the acquisition of the MR data carried out by the acquisition unit 4 will be exemplarily described with reference to FIG. 2.

Figure 2:
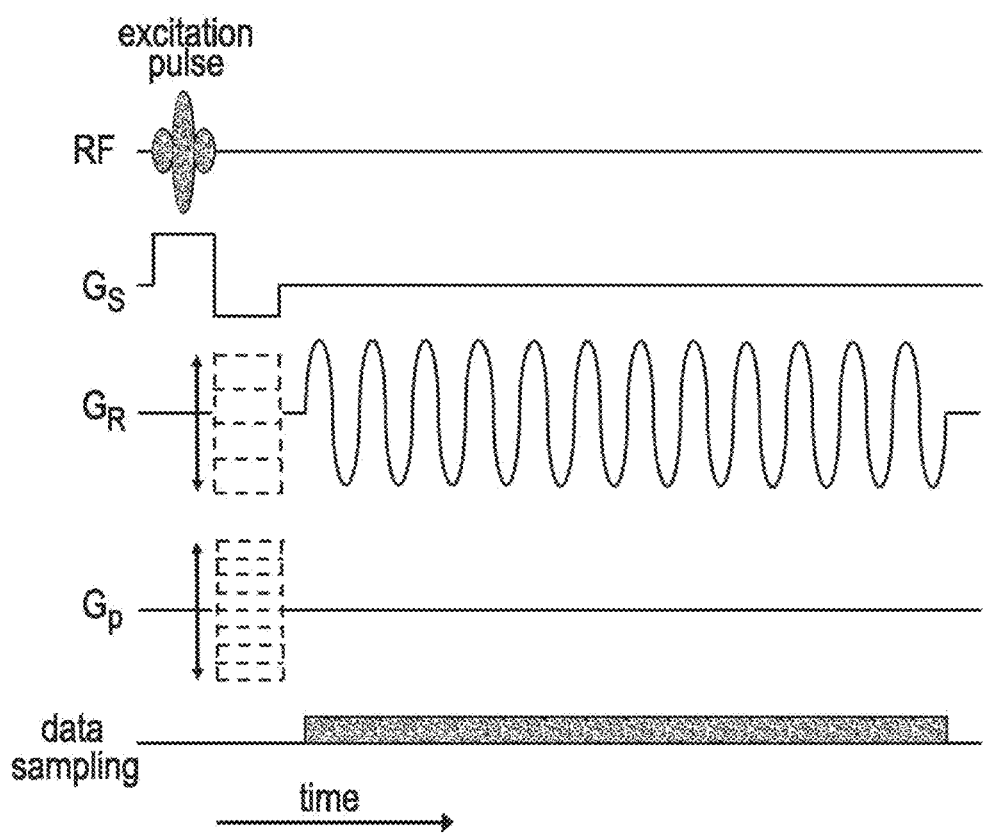
FIG. 2 illustrates schematically and exemplarily a pulse sequence diagram defining a readout module.

FIG. 2 shows a pulse sequence diagram illustrating how RF pulses, magnetic field gradient pulses and data sampling are synchronized to provide the MR data. In particular, the pulse sequence diagram illustrates readout-segmented EPSI carried out by the acquisition unit 4 by showing RF, slice-selection gradient $G_S$, readout gradient $G_R$, i.e. first encoding gradient, and phase-encoding gradient $G_P$, i.e. second encoding gradient, pulses and data sampling. The oscillating readout gradient along $G_R$ generates an echo train, which is used to acquire a separate image for each positive and for each negative gradient lobe. The complete FIG. 2 represents a readout module that is repeated for multiple values of the stepped-encoding gradients, which are shown as dashed lines in the figure.

Thus, a train of gradient echoes is sampled using an oscillating readout gradient, which is preceded by stepped encoding gradients in both readout and phase-encoding directions. Stepped encoding gradients provide specific positions in k-space from which the sampling of k-space raw data points starts at each repetition. The readout module shown in FIG. 2 is repeated for different permutations of these encoding gradients until sufficient k-space raw data points have been acquired to achieve a desired spatial resolution. FIG. 2 illustrates a two-dimensional version of the sequence, in which a spatial selection in the slice direction is achieved by using a frequency-selective RF excitation pulse in combination with a slice-select gradient $G_S$. Alternatively, the technique can be implemented as a three-dimensional sequence using the known method of adding an additional stepped phase-encoding gradient in the slice direction.

The general technique of acquiring spatially encoded MR signals using a stepped phase-encoding gradient is a well-established fundamental method in MR imaging, termed spin-warp NMR imaging. This technique is disclosed, for instance, in the article "Spin warp NMR imaging and application to human whole-body imaging" by W. A. Edelstein et al., Physics in Medicine and Biology, 25:751-756 (1980), which is herewith incorporated by reference. In this widely-used standard case, fixed (non-stepped) readout gradient pulses are used to sample all required data points in the readout ($k_x$) direction at each repetition. A known modification of this standard case is to use a stepped readout-encoding gradient (also called readout pre-phase gradient) with a different amplitude at each repetition as disclosed, for instance, in the articles "Diffusion-weighted multiple shot echo planar imaging of humans without navigation" by M. Robson et al., Magnetic Resonance in Medicine 38(1):82-8 (1997), "vGRASE: separating phase and T2 modulations in 2D" by K. Oshio, Magnetic Resonance in Medicine, 44(3): 383-6 (2000) and "High resolution diffusion-weighted imaging using readout-segmented echo-planar imaging, parallel imaging and a two-dimensional navigator based reacquisition" by D. A. Porter et al., Magnetic Resonance in Medicine, 62(2):468-75 (2009), which are herewith incorporated by reference. This modification is generally referred to as mosaic k-space sampling or readout segmentation because each repetition samples a subset of contiguous $k_x$ points, or 'segment' of k-space in the readout direction. With both standard spin-warp imaging and the modified readout-segmented technique, spatial encoding in the third (z) direction can be achieved by frequency-selective slice excitation or by adding an additional stepped encoding gradient in the third dimension, requiring additional repetitions of the readout module as disclosed in "MRI: Basic Principles and Applications" by B. M. Dale et al., ISBN: 978-1-119-01305-1, October 2015, Wiley-Blackwell, which is herewith incorporated by reference. When slice selection is used, the final image is generated by performing a 2D Fourier transformation on the k-space data acquired at each individual slice position. When stepped encoding is used in the third (z) dimension, images are generated by performing a 3D Fourier transformation on the k-space data. When performing the known standard method of spectroscopic imaging, for instance, as described in the above mentioned article by S. Posse et al. which is herewith incorporated by reference, data for each point in k-space (either 2D or 3D) are sampled at multiple time points after the RF excitation pulse. An additional Fourier transformation with respect to this time axis then provides spectral information at each voxel location in the spatially encoded data set.

In the known EPSI method as disclosed, for instance, in the above mentioned article by P. Mansfield et al., which is herewith incorporated by reference, a standard stepped-encoding gradient is used in the phase-encoding direction to acquire MR data for a single $k_y$ value at each iteration, but no stepped encoding is performed in the readout direction; consequently in the standard technique, the moment of each readout gradient in the echo train has to be large enough to cover the full range of raw data $k_x$ points, which sets a lower limit to the echo spacing and a corresponding upper limit to the spectral bandwidth. As the required gradient moment increases with spatial resolution, this limitation to the spectral bandwidth also becomes more severe with increasing spatial resolution. However, by using the acquisition scheme applied by the acquisition unit 4, the echo spacing is decoupled from the spatial resolution because the minimum echo spacing is now defined by the number of $k_x$ points within each readout segment and this value can be chosen freely to achieve a desired spectral bandwidth.

Each combination of a step of the first encoding gradient $G_R$ in the readout direction and a step of the second encoding gradient $G_P$ in the phase-encoding direction defines a respective segment within a k-space, wherein a first direction $k_x$ in the k-space corresponds to the readout direction and a second direction $k_y$ in the k-space corresponds to the phase-encoding direction, wherein the acquisition unit 4 is adapted to acquire the MR data such that not for all segments in the k-space MR data are acquired. In particular, the acquisition unit 4 is adapted to acquire the MR data such that segments, for which MR data are acquired, and segments, for which MR data are not acquired, are distributed randomly.

The stepping of the first encoding gradient in the first direction $k_x$ of the k-space divides the k-space into several columns each comprising several of the segments, wherein the acquisition unit 4 is adapted to acquire the MR data such that the distribution of segments, for which MR data are acquired, and of segments, for which MR data are not acquired, is different in at least two different columns. In an embodiment the acquisition unit 4 is adapted to acquire the MR data such that the distribution of segments, for which MR data are acquired, and of segments, for which MR data are not acquired, is different in different columns having different absolute positions in the first direction $k_x$ of the k-space.

In an embodiment the acquisition unit 4 is adapted to acquire the MR data such that in each column the segments, for which MR data are acquired, and the segments, for which MR data are not acquired, are distributed randomly. In particular, for each column a different set of random sampling points in the second direction $k_y$ of the k-space, which corresponds to the phase-encoding direction, can be used.

In an embodiment the acquisition unit 4 is adapted to acquire the MR data such that the ratio of the segments, for which MR data are not acquired, to the segments, for which MR data are acquired, is different in at least two different columns. In particular, the acquisition unit 4 is adapted to acquire the MR data such that the ratio depends on the position of the respective column in the first direction of the k-space. For instance, the acquisition unit 4 is adapted to acquire the MR data such that the ratio depends on the position in the first direction of the k-space of the respective column. Thus, in an embodiment each column can use a ratio, which may also be regarded as being an undersampling factor or an acceleration factor, which increases with its offset in the first direction $k_x$ from the k-space centre. This allows the acquisition to be adapted to the data sparsity, which can increase at high spatial frequencies which correspond to large offsets in the first direction from the k-space centre.

Figure 3:
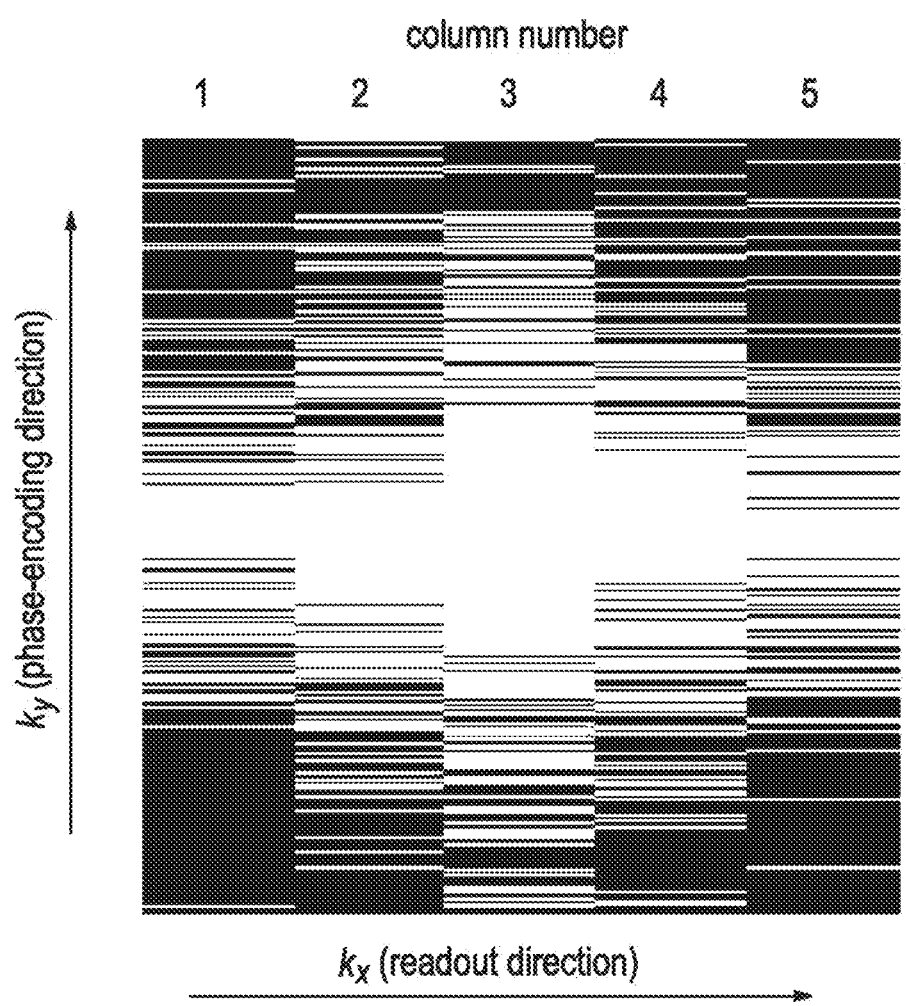
FIG. 3 illustrates exemplarily and schematically a k-space with sampled and unsampled segments.

FIG. 3 exemplarily illustrates a corresponding distribution of the segments in the k-space, wherein the k-space centre is in the centre of the figure and wherein the white lines represent segments, for which MR data are acquired, and the black lines represent segments for which MR data are not acquired. It shows an optimized undersampling scheme for the case of five columns, where the first direction $k_x$, which corresponds to the readout direction, and the second direction $k_y$, which corresponds to the phase-encoding direction, are horizontal and vertical, respectively. The ratio is about 0.5 for the central column and 1.0 and 2.0 for the first and second side columns, respectively.

Figure 4:
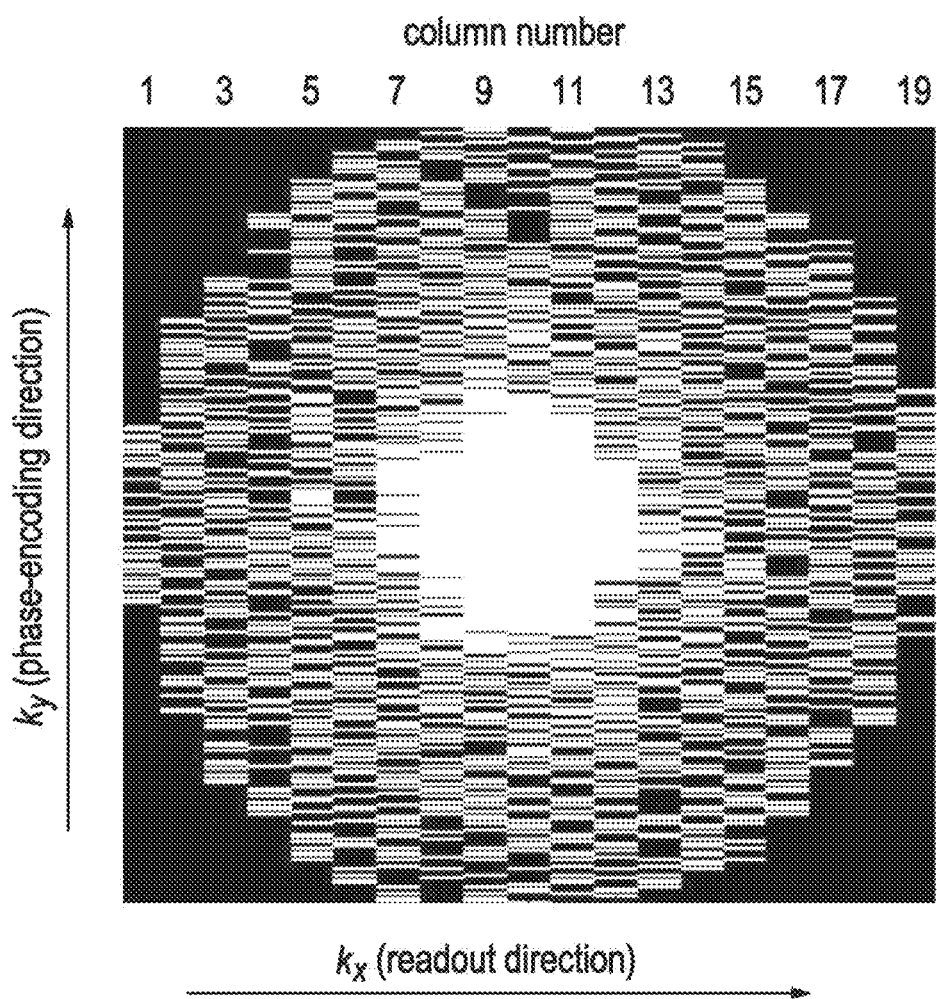
FIG. 4 illustrates schematically and exemplarily a further k-space with sampled and unsampled segments.

In an embodiment the acquisition unit 4 can be adapted to acquire the MR data such that at least some columns comprise first ranges of segments, which include randomly distributed segments for which MR data are acquired, and second ranges of segments, which do not include any segments for which MR data are acquired, wherein the size of these ranges is different for at least two different columns. Thus, the random distribution of the segments may be applied only within the first ranges in the respective columns. In particular, the acquisition unit 4 can be adapted to acquire the MR data such that the first ranges decrease and the second ranges increase with increasing offset from the k-space centre in the first direction of the k-space for the respective column. This allows the number of sample points for columns with large absolute offsets in the first direction to be further reduced by skipping unnecessary data points at, for instance, the corners of the k-space. The acquisition unit 4 can be adapted to acquire the MR data such that the second ranges are located at the upper and/or lower ends of the respective column with respect to the second direction of the k-space. FIG. 4 illustrates a corresponding example of the acquisition scheme, which might be regarded as being an elliptical sampling scheme, for the case of 19 columns and an overall ratio of segments (black), for which MR data are not acquired, to segments (white), for which MR data are acquired, of about 2 in this example, both the sampling density and the first and second ranges along the second direction $k_y$ are varied as a function of the column offset from the k-space centre.

In an embodiment the acquisition unit 4 is adapted to acquire the MR data for different points in time such that MR data are acquired for several k-spaces which correspond to the different points in time, wherein a ratio of the segments, for which MR data are not acquired in the respective k-space, to the segments, for which MR data are acquired in the respective k-space, increases with time. Thus, for instance, compressed sensing may be used with multiple-echo acquisitions that produce multiple k-spaces at different respective echo times, wherein this optimization may exploit the fact that, due to T2* decay, images at late echo times show increasing sparsity and reduced SNR. This increased sparsity allows the undersampling factor to be increased for the later echoes.

Moreover, in an embodiment the acquisition unit 4 is adapted to acquire the MR data for different points in time such that MR data are acquired for several k-spaces which correspond to the different points in time, wherein a range, in which MR data are acquired, in the second direction $k_y$, increases with increasing time, without increasing the number of steps of the second encoding gradient. Thus, for instance, for later echoes with higher data sparsity the same number of phase-encoding steps can be used to sample a greater range in the second direction $k_y$ of the k-space. The increased sparsity can therefore be exploited to achieve an increased spatial resolution for later echoes.

In an embodiment the acquisition unit 4 is adapted to acquire the MR data for different points in time such that MR data are acquired for several k-spaces which correspond to the different points in time, wherein spatial resolution is kept constant and a FOV in an image domain is increased with increasing time, without increasing the number of steps of the second encoding gradient $G_P$. Thus, for instance, for later echoes with higher data sparsity, the same number of phase-encoding steps can be used with an increased image-domain FOV, corresponding to an oversampling of the MR data in the second direction $k_y$ of the k-space in the native acquisition, i.e. before application of the compressed sensing undersampling mask. This can lead to an increased sampling randomness at later echoes, which can improve the performances of compressed sensing reconstruction to extend the data sampling to later time points with suitable SNR, resulting in a higher spectral resolution.

If the FOV along one direction in the image domain is increased whilst preserving the original spatial resolution, the corresponding k-space has the same extension along that direction, but it is sampled on a finer grid, i.e., the number of steps in k-space along that direction is greater and the steps are smaller in proportion to the enlargement of the FOV. This modification is regarded as oversampling. Thus, in this case "undersampling" and "oversampling" are simultaneously present; "undersampling" because not all prescribed k-space data points are sampled and "oversampling" because the grid of prescribed k-space data points is more closely spaced than required for the specified FOV.

Figure 5:
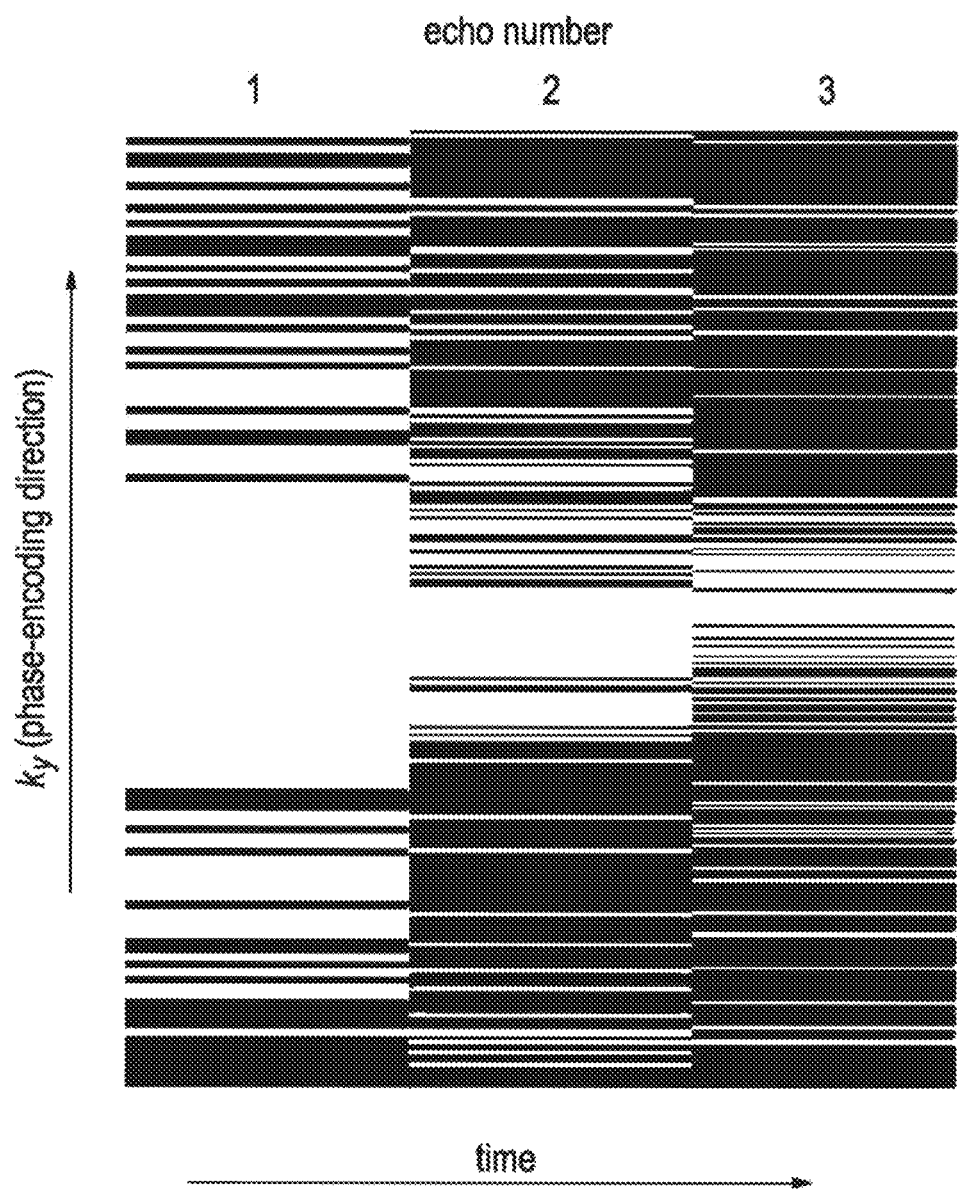
FIG. 5 illustrates schematically and exemplarily segments of a k-space for different points in time.

An example of how the undersampling scheme can be adapted in this way is provided in FIG. 5 for the illustrative example of three successive echoes with increasing undersampling factors (ratio of non-acquired to acquired data points) of 0.5, 2.0 and 3.5, respectively. The corresponding FOVs along the phase-encoding direction are increased by the same factors whilst keeping the overall range of $k_y$ points the same (i.e. fixed spatial resolution). Thus, both the undersampling factor and the FOV are increased progressively with increasing echo number in the echo train.

Figure 6:
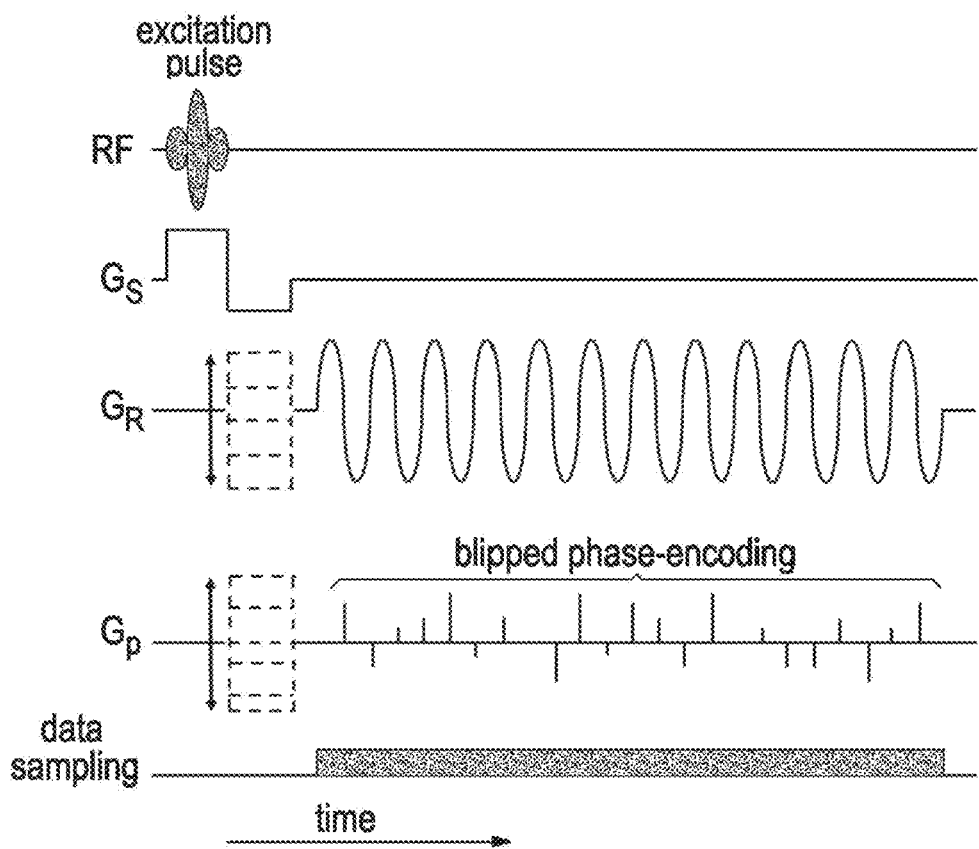
FIG. 6 illustrates schematically and exemplarily a further pulse sequence diagram defining a readout module.

The echo-specific undersampling scheme can be achieved by adding phase-encoding blipped gradients along the $G_P$ (phase-encoding) axis, as shown in the sequence diagram of FIG. 6. Note that all aspects of the invention can be extended to a 3D sequence, in which both stepped- and blipped-phase-encoding gradients are also executed along the $G_S$ (slice-selection) direction.

FIG. 6 shows a pulse sequence diagram for accelerated, readout-segmented EPSI using compressed sensing. The figure shows RF, slice-selection gradient $G_S$, readout gradient $G_R$ and phase-encoding gradient $G_P$ pulses and data sampling. The oscillating readout gradient along $G_R$ generates an echo train, which is used to acquire MR data for separate k-spaces for each positive and for each negative gradient lobe. The complete figure represents a readout module that is repeated for multiple values of the stepped-encoding gradients, which are shown as dashed lines in the figure. Compared to the non-accelerated sequence, shown in FIG. 2, the sequence has a modified gradient along the $G_P$ axis as follows: (1) the dashed encoding gradient is executed with non-uniform steps between each execution of the readout module to provide undersampling in the $k_y$ (phase-encoding) direction, which is specific to the readout segment being measured, defined by the stepped-encoding gradient along $G_R$; (2) a blipped phase-encoding gradient $G_P$ is used to adapt the undersampling scheme to each individual k-space and hence image in the echo train. For more details regarding the sequence design for undersampling schemes that change echo by echo along an echo train reference is made to "3D compressed sensing for highly accelerated hyperpolarized 13C MRSI with in vivo applications to transgenic mouse models of cancer" by S. Hu et al., Magnetic Resonance in Medicine, 63(2):312-321 (2010).

Figure 7:
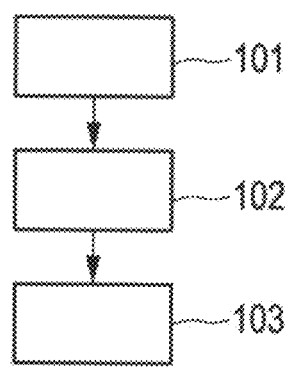
FIG. 7 shows a flowchart exemplarily illustrating an embodiment of a method for performing EPSI.

In the following an embodiment of a method for performing EPSI will exemplarily be described with reference to a flowchart shown in FIG. 7.

In step 101 MR data are acquired, wherein the acquisition unit 4 uses the first encoding gradient $G_R$ in the readout direction and the second encoding gradient $G_P$ in the phase-encoding direction, wherein the first encoding gradient $G_R$ and the second encoding gradient $G_P$ are stepped. In step 102 an MR image is reconstructed based on the acquired MR data by the reconstruction unit 6, and in step 103 the reconstructed MR image is shown by the output unit 9.

Figure 8:
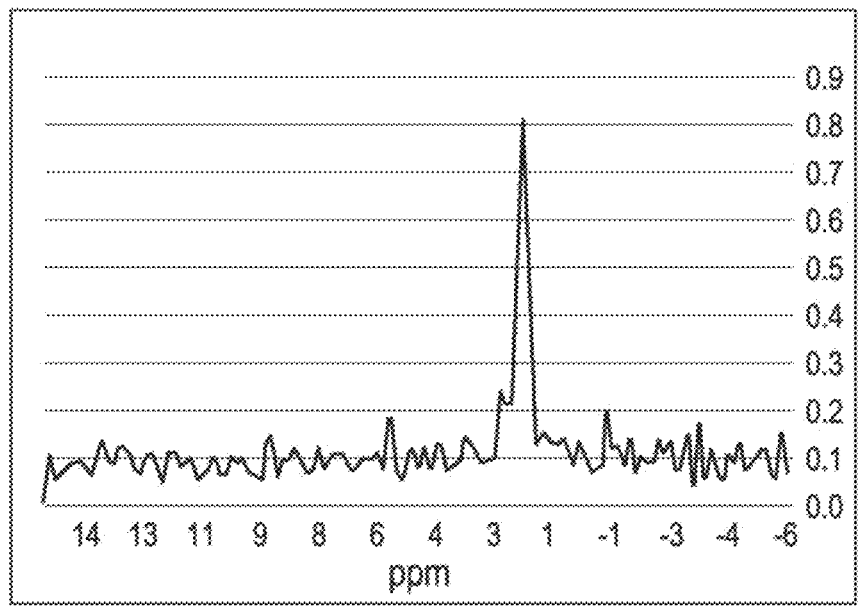
FIGS. 8 to 11 schematically and exemplarily show single voxel spectra for different anatomical regions of a knee.
Figure 9:
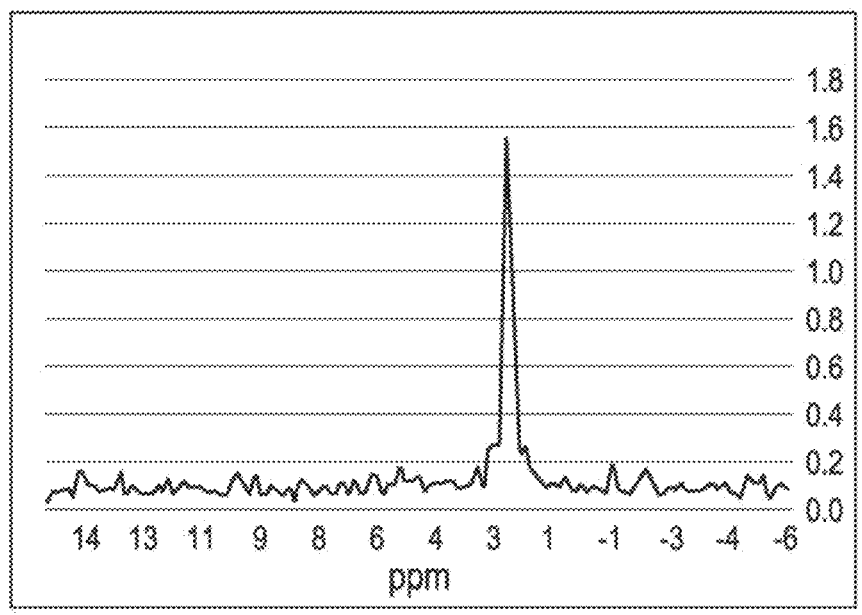
Figure 10:
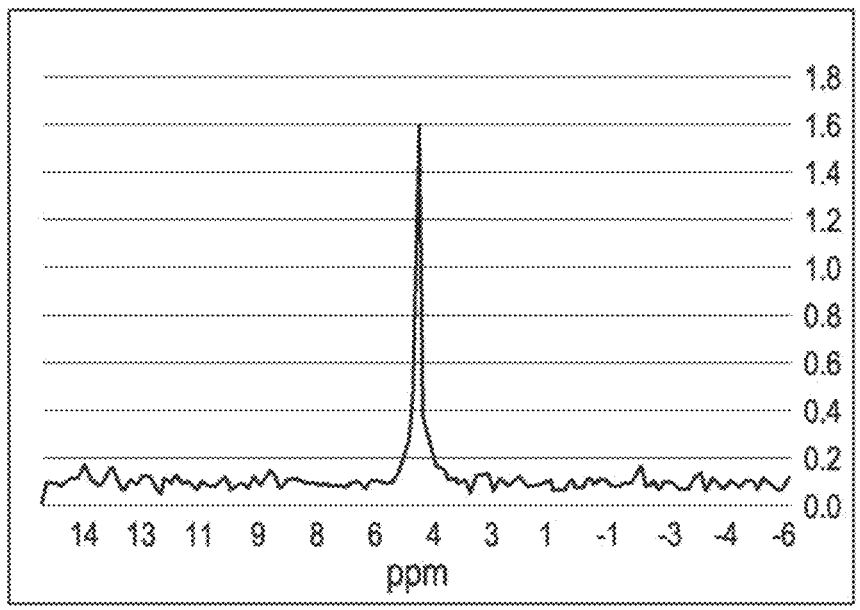
Figure 11:
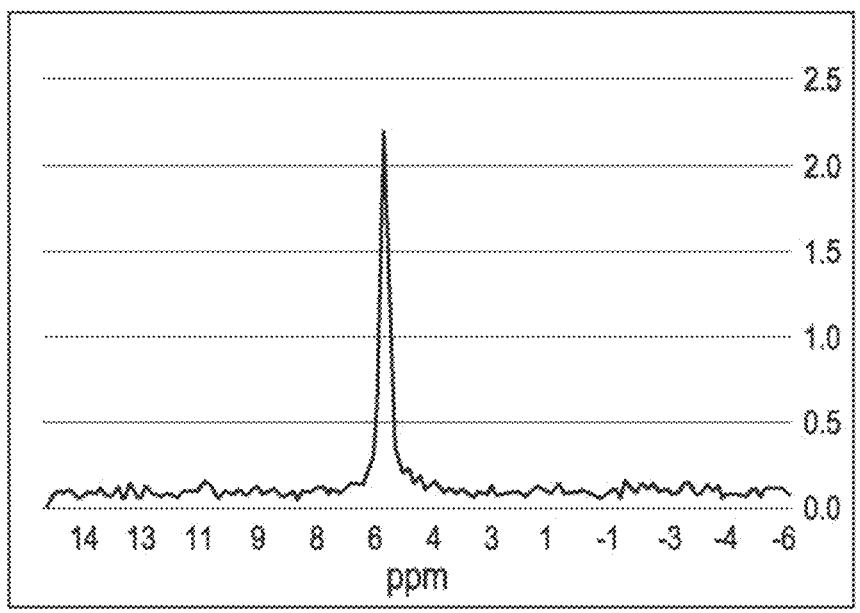
Figure 12:
FIG. 12 shows exemplarily and schematically a reconstructed water image of the knee.
Figure 13:
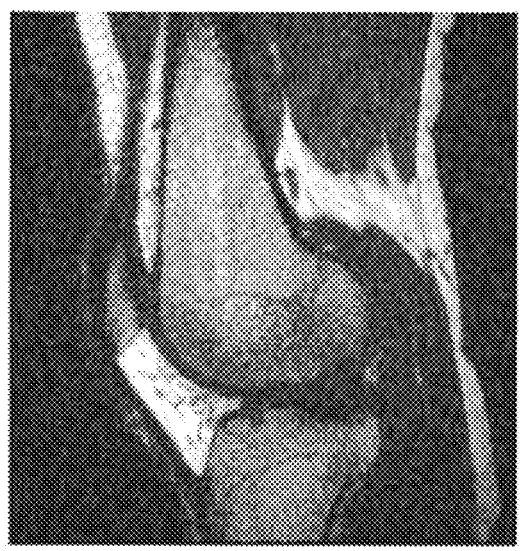
FIG. 13 shows exemplarily and schematically a fat image of the knee.

The MR image reconstructed by the reconstruction unit 6 is a spectral image, wherein for each voxel of the image a spectrum is reconstructed. FIGS. 8 to 11 exemplarily show single voxel spectra for four different voxels in four different anatomical regions of a knee. FIGS. 8 and 9 show spectral peaks from $^1H$ nuclei in fat molecules within femoral bone marrow and the infrapatellar pad respectively. FIGS. 10 and 11 show spectral peaks from $^1H$ nuclei in water molecules within muscle and cartilage respectively. In this example high-bandwidth, spectroscopic $^1H$ imaging was performed in vivo in accordance with the above described method, but without undersampling, wherein sagittal images of the knee are reconstructed using a voxel size of 0.8×0.8×2.0 mm and spectra were obtained with a bandwidth of 2.8 kHz, which is a factor of 8 higher than for a typical comparable acquisition using standard EPSI. The MR data used for this reconstruction were acquired at 3 T. The single voxel spectra show a prominent fat or water peak, according to tissue type. FIGS. 12 and 13 show how this spectral information can be used to robustly separate the signal contributions from water (FIG. 12) and fat (FIG. 13) into separate images. The images were generated by integrating the spectra for each voxel over two specified ppm ranges, corresponding to fat and water signals respectively; these integral values were then used to define the voxel intensities in the respective fat and water images.

Standard EPSI is severely limited by a low spectral bandwidth, which is insufficient for many applications, particularly at high field strength, at high spatial resolution or for metabolites with a large range of chemical shifts. In the article "High-speed spatially resolved NMR spectroscopy using phase-modulated spin-echo trains. Expansion of the spectral bandwidth by combined use of delayed spin-echo trains." by S. Matsui et al., Journal of Magnetic Resonance, 64:167-171 (1985) it is therefore proposed to increase the spectral bandwidth in EPSI by acquiring multiple acquisitions with different time shifts. However, this results in a temporal overlap between signals at different time points, which disrupts the natural phase evolution of signals with higher spatial frequencies. A further disadvantage for acquisitions performed in vivo is that motion or flow effects between the separate time-shifted acquisitions can cause a complex modulation of the resulting spectrum. The system and method described above with reference to FIGS. 1 to 13 provides an alternative approach to increasing the spectral bandwidth in EPSI, which avoids the temporal overlap and produces less severe errors in the presence of motion. They provide a modified version of EPSI, which avoids the bandwidth limitation of the standard technique and extends MRSI to a wide range of new clinical applications, by performing EPSI using readout segmentation with standard image reconstruction techniques. They also provide an accelerated version of the new readout-segmented EPSI sequence using a dedicated approach to compressed sensing by not acquiring MR data for each segment of the k-space.

The system and method described above with reference to FIGS. 1 to 13 can represent a significant addition to the range of clinical and pre-clinical imaging techniques that are available with MR. Clinical High Spectral and Spatial resolution (HiSS) MM protocols can be transferred from 1.5 T to 3 T and a robust analysis of data can be enabled due to the absence of confounding aliasing artifacts that occur when the spectral bandwidth is low. HiSS is disclosed, for instance, in the article "Breast MR Imaging with High Spectral and Spatial Resolutions: Preliminary Experience 1" by Du W. et al., Radiology, 224(2):577-585 (2002), which is herewith incorporated by reference. It can also enable high-bandwidth metabolite mapping at ultra-high field strengths of 7 T and above, where the increased SNR will allow the proposed technique to map metabolites in vivo with an unprecedented level of spatial resolution. At the other extreme, the technique can be of interest for less-expensive, low-field systems, where low-performance gradient systems and poor static field homogeneity make it difficult to perform spectrally-selective fat and water imaging with standard techniques. In addition, the proposed readout-segmented EPSI approach can offer benefits for pre-clinical imaging studies, which require high spatial resolution and are performed at high field strengths.

Although in above described embodiments the scan time is reduced by compressed sensing, in other embodiments the scan time can be reduced in another way. For instance, known methods of parallel imaging like SENSE or GRAPPA, a partial Fourier acquisition in the readout direction or known techniques for simultaneous multi-slice imaging like CAIPIRINHA can be used. SENSE is disclosed, for instance, in the article "SENSE: Sensitivity Encoding for Fast MRI" by Preussmann K. P. et al., Magnetic Resonance in Medicine, 42(5):952-62 (1999), GRAPPA is disclosed in, for instance, the article "Generalized Autocalibrating Partially Parallel Acquisitions (GRAPPA)" by Griswold M. A. et al., Magnetic Resonance in Medicine, 47(6):1202-10 (2002), the partial Fourier acquisition is disclosed in, for instance, "Implementation and assessment of diffusion-weighted partial Fourier readout segmented echo-planar imaging" by R. Frost et al., Magnetic Resonance in Medicine, 68(2):441-51 (2012) and CAIPIRINHA is disclosed, for instance, in the article "Controlled aliasing in parallel imaging results in higher acceleration (CAIPIRINHA) for multi-slice imaging" by Breuer et al., Magnetic Resonance in Medicine, 53(3):684-91 (2005), which are herewith incorporated by reference.

Although in above described embodiments MR data of a person are acquired, in other embodiments MR data of other objects can be acquired like MR data of animals, of food samples, of oil-containing rock samples et cetera.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfil the functions of several items recited in the claims. The mere fact that certain measures are recited in mutually different dependent claims does not indicate that a combination of these measures cannot be used to advantage.

The control of the system for performing EPSI in accordance with the method for performing EPSI can be implemented as program code means of a computer program and/or as dedicated hardware.

A computer program may be stored/distributed on a suitable medium, such as an optical storage medium or a solid-state medium or a tangible computer-readable medium, supplied together with or as part of other hardware, but may also be distributed in other forms, such as via the Internet or other wired or wireless telecommunication systems.

Any reference signs in the claims should not be construed as limiting the scope.

The invention claimed is:

1. A system for performing echo-planar spectroscopic imaging, comprising:
   an acquisition unit for acquiring magnetic resonance data, wherein the acquisition unit is structured to use a first encoding gradient ($G_R$) in a readout direction and a second encoding gradient ($G_P$) in a phase-encoding direction, wherein the first encoding gradient and the second encoding gradient are stepped, wherein each combination of a step of the first encoding gradient in the readout direction and a step of the second encoding gradient in the phase-encoding direction defines a respective segment within a k-space, and wherein a first direction ($k_x$) in the k-space corresponds to the readout direction and a second direction ($k_y$) in the k-space corresponds to the phase-encoding direction; and
   a reconstruction unit for reconstructing a magnetic resonance image based on the acquired magnetic resonance data.

2. The system of claim 1 wherein the acquisition unit is adapted to acquire the magnetic resonance data such that in the k-space magnetic resonance data are not acquired for all segments.

3. The system of claim 2 wherein the acquisition unit is adapted to acquire the magnetic resonance data such that segments, for which magnetic resonance data are acquired, and segments, for which magnetic resonance data are not acquired, are distributed randomly.

4. The system of claim 2 wherein the stepping of the first encoding gradient in the first direction ($k_x$) of the k-space divides the k-space into several columns each comprising several of the segments, wherein the acquisition unit is adapted to acquire the magnetic resonance data such that the distribution of segments, for which magnetic resonance data are acquired, and of segments, for which magnetic resonance data are not acquired, is different in at least two different columns.

5. The system of claim 4 wherein the acquisition unit is adapted to acquire the magnetic resonance data such that the distribution of segments, for which magnetic resonance data are acquired, and of segments, for which magnetic resonance data are not acquired, is different in different columns having different absolute positions in the first direction ($k_x$) of the k-space.

6. The system of claim 4 wherein the acquisition unit is adapted to acquire the magnetic resonance data such that in each column the segments, for which magnetic resonance data are acquired, and the segments, for which magnetic resonance data are not acquired, are distributed randomly.

7. The system of claim 6 wherein the acquisition unit is adapted to acquire the magnetic resonance data such that at least some columns comprise first ranges of segments, which include randomly distributed segments for which MR data are acquired, and second ranges of segments, for which MR data are not acquired, wherein the size of these ranges is different for at least two different columns.

8. The system of claim 7 wherein the acquisition unit is adapted to acquire the magnetic resonance data such that the first ranges decrease and the second ranges increase with increasing distance from the centre of k-space in the first direction ($k_x$) of the k-space for the respective column.

9. The system of claim 4 wherein the acquisition unit is adapted to acquire the magnetic resonance data such that a ratio of the segments, for which magnetic resonance data are not acquired, to the segments, for which magnetic resonance data are acquired, is different in at least two different columns.

10. The system of claim 9 wherein the acquisition unit is adapted to acquire the magnetic resonance data such that the ratio depends on the position of the respective column in the first direction ($k_x$) of the k-space.

11. The system of claim 2 wherein the acquisition unit is adapted to acquire the magnetic resonance data for different points in time such that magnetic resonance data are acquired for several k-spaces which correspond to the different points in time, wherein a ratio of the segments, for which magnetic resonance data are not acquired in the respective k-space, to the segments, for which magnetic resonance data are acquired in the respective k-space, increases with time.

12. The system of claim 2 wherein the acquisition unit is adapted to acquire the MR data for different points in time such that magnetic resonance data are acquired for several k-spaces which correspond to the different points in time, wherein a range, in which magnetic resonance data are acquired, in the second direction ($k_y$) increases with increasing time while preserving the same field-of-view, without increasing the number of steps of the second encoding gradient ($G_P$).

13. The system of claim 2 wherein the acquisition unit is adapted to acquire the MR data for different points in time such that magnetic resonance data are acquired for several k-spaces which correspond to the different points in time, wherein a field-of-view in an image domain is increased with increasing time while preserving spatial resolution, without increasing the number of steps of the second encoding gradient ($G_P$).

14. A method for performing echo-planar spectroscopic imaging, comprising:
    under control of an acquisition unit, acquiring magnetic resonance data using a first encoding gradient ($G_R$) in a readout direction and a second encoding gradient ($G_P$) in a phase-encoding direction, wherein the first encoding gradient and the second encoding gradient are stepped, wherein each combination of a step of the first encoding gradient in the readout direction and a step of the second encoding gradient in the phase-encoding direction defines a respective segment within a k-space, and wherein a first direction ($k_x$) in the k-space corresponds to the readout direction and a second direction ($k_y$) in the k-space corresponds to the phase-encoding direction; and
    under control of a reconstruction unit, reconstructing a magnetic resonance image based on the acquired magnetic resonance data.

15. A non-transitory computer readable memory medium containing computer program instructions for controlling a computer processor in an echo-planar spectroscopic imaging system having an acquisition unit and a reconstruction unit, when executed, to perform echo-planar spectroscopic imaging by performing a method comprising:
    under control of the acquisition unit, acquiring magnetic resonance data, using a first encoding gradient ($G_R$) in a readout direction and a second encoding gradient ($G_P$) in a phase-encoding direction, wherein the first encoding gradient and the second encoding gradient are stepped, wherein each combination of a step of the first encoding gradient in the readout direction and a step of the second encoding gradient in the phase-encoding direction defines a respective segment within a k-space, and wherein a first direction ($k_x$) in the k-space corresponds to the readout direction and a second direction ($k_y$) in the k-space corresponds to the phase-encoding direction; and
    under control of the reconstruction unit, reconstructing a magnetic resonance image based on the acquired magnetic resonance data.

* * * * *

UNITED STATES PATENT AND TRADEMARK OFFICE
CERTIFICATE OF CORRECTION

PATENT NO. : 10,739,429 B2  
APPLICATION NO. : 16/095345  
DATED : August 11, 2020  
INVENTOR(S) : David Porter et al.

Page 1 of 3

It is certified that error appears in the above-identified patent and that said Letters Patent is hereby corrected as shown below:

In the Claims

In Column 12, Line 19 (Claim 1), "($G_R$)" should read --($G_R$)--.

In Column 12, Line 20 (Claim 1), "($G_P$)" should read --($G_P$)--.

In Column 12, Line 26 (Claim 1), "k-space" should read --$k$-space--.

In Column 12, Line 27 (Claim 1), "$k_x$" should read --$k_x$--.

In Column 12, Line 27 (Claim 1), "k-space" should read --$k$-space--.

In Column 12, Line 28 (Claim 1), "$k_y$" should read --$k_y$--.

In Column 12, Line 28 (Claim 1), "k-space" should read --$k$-space--.

In Column 12, Line 35 (Claim 2), "k-space" should read --$k$-space--.

In Column 12, Line 43 (Claim 4), "$k_x$" should read --$k_x$--.

In Column 12, Line 43 (Claim 4), "k-space" should read --$k$-space--.

In Column 12, Line 44 (Claim 4), "k-space" should read --$k$-space--.

In Column 12, Line 56 (Claim 5), "$k_x$" should read --$k_x$--.

In Column 12, Line 57 (Claim 5), "k-space" should read --$k$-space--.

In Column 13, Line 6 (Claim 8), "k-space" should read --$k$-space--.

Signed and Sealed this  
Second Day of February, 2021

Drew Hirshfeld  
*Performing the Functions and Duties of the*  
*Under Secretary of Commerce for Intellectual Property and*  
*Director of the United States Patent and Trademark Office*

CERTIFICATE OF CORRECTION (continued)
U.S. Pat. No. 10,739,429 B2

In Column 13, Line 7 (Claim 8), "k$_x$" should read --k$_x$--.

In Column 13, Line 7 (Claim 8), "k-space" should read --*k*-space--.

In Column 13, Line 16 (Claim 10), "k$_x$" should read --k$_x$--.

In Column 13, Line 16 (Claim 10), "k-space" should read --*k*-space--.

In Column 13, Line 20 (Claim 11), "k-spaces" should read --*k*-spaces--.

In Column 13, Line 23 (Claim 11), "k-space" should read --*k*-space--.

In Column 13, Line 24 (Claim 11), "k-space" should read --*k*-space--.

In Column 13, Line 29 (Claim 12), "k-spaces" should read --*k*-spaces--.

In Column 13, Line 31 (Claim 12), "k$_y$" should read --k$_y$--.

In Column 13, Line 34 (Claim 12), "(G$_P$)" should read --(G$_P$)--.

In Column 13, Line 38 (Claim 13), "k-spaces" should read --*k*-spaces--.

In Column 13, Line 42 (Claim 13), "(G$_P$)" should read --(G$_P$)--.

In Column 14, Line 4 (Claim 14), "(G$_R$)" should read --(G$_R$)--.

In Column 14, Line 6 (Claim 14), "(G$_P$)" should read --(G$_P$)--.

In Column 14, Line 11 (Claim 14), "k-space" should read --*k*-space--.

In Column 14, Line 12 (Claim 14), "k$_x$" should read --k$_x$--.

In Column 14, Line 12 (Claim 14), "k-space" should read --*k*-space--.

In Column 14, Line 14 (Claim 14), "k$_y$" should read --k$_y$--.

In Column 14, Line 14 (Claim 14), "k-space" should read --*k*-space--.

In Column 14, Line 27 (Claim 15), "(G$_R$)" should read --(G$_R$)--.

In Column 14, Line 29 (Claim 15), "(G$_P$)" should read --(G$_P$)--.

In Column 14, Line 34 (Claim 15), "k-space" should read --*k*-space--.

In Column 14, Line 35 (Claim 15), "k$_x$" should read --k$_x$--.

CERTIFICATE OF CORRECTION (continued)
U.S. Pat. No. 10,739,429 B2

In Column 14, Line 35 (Claim 15), "k-space" should read --$k$-space--.

In Column 14, Line 37 (Claim 15), "$k_y$" should read --$k_y$--.

In Column 14, Line 37 (Claim 15), "k-space" should read --$k$-space--.